United States Patent [19]
Bingham et al.

[11] Patent Number: 5,872,363
[45] Date of Patent: Feb. 16, 1999

[54] AUTOMATIC POLE ZERO ADJUSTMENT CIRCUIT FOR AN IONIZING RADIATION SPECTROSCOPY SYSTEM

[75] Inventors: Russell David Bingham; Jesse Ursery, Jr., both of Knoxville, Tenn.

[73] Assignee: EG&G Instruments, Inc., Oak Ridge, Tenn.

[21] Appl. No.: 782,240

[22] Filed: Jan. 14, 1997

[51] Int. Cl.$^6$ ................................................. G01T 1/17
[52] U.S. Cl. .............................. 250/363.01; 250/370.06
[58] Field of Search ........................... 250/336.1, 370.06, 250/370.01; 327/180, 172, 14, 15, 552, 309, 311; 364/724.011, 724.013, 724.014, 724.17, 724.19

[56] References Cited

U.S. PATENT DOCUMENTS

4,866,400  9/1989  Britton, Jr. et al. .
5,393,982  2/1995  Mott et al. ...................... 250/370.06
5,684,850  11/1997  Warburton et al. ...................... 378/53

*Primary Examiner*—Edward P. Westin
*Assistant Examiner*—Richard Hanig
*Attorney, Agent, or Firm*—Iandiorio & Teska

[57] ABSTRACT

An automatic pole-zero adjustment circuit for an ionizing radiation spectroscopy system includes a digital conversion circuit, responsive to random analog pulses passing through the system for converting the random analog pulses to digital pulses; a programmable digital shaping filter including means for applying a pole-zero cancellation adjustment to compensate for under/overshoot at the output of the programmable digital shaping filter; digitally programmable sampling means including means for defining a window for sampling the trailing edge of the digital pulses and means for sampling the digital pulses during that window to determine the presence of undershoot or overshoot; and a digitally programmable control circuit, responsive to the pole-zero sampling means, for driving the programmable digital shaping filter to introduce an under/overshoot correction signal to the digital programmable shaping filter.

22 Claims, 4 Drawing Sheets

AUTOMATIC POLE ZERO ADJUSTMENT CIRCUIT FOR AN IONIZING RADIATION SPECTROSCOPY SYSTEM

FIELD OF INVENTION

This invention relates to an automatic pole zero adjustment circuit for an ionizing radiation spectroscopy system.

BACKGROUND OF INVENTION

Radiation detection systems generally employ a radiation detector such as a germanium or scintillation detector or photodiode to detect radiation from a radiation source such as alpha or gamma rays or light. The detection of such energy results in a charge pulse whose amplitude is proportional to the energy of the incident radiation. The charge pulse is converted to a voltage pulse by a feedback capacitor incorporated in a preamplifier. A resistor is added in parallel with the capacitor in order to discharge the capacitor in preparation for the next pulse in a reasonable amount of time to allow for processing of successive pulses. The parallel combination of the capacitor and the resistor defines the time constant of the exponentially decay of the voltage pulse. The voltage pulse with the exponentially decaying trailing edge is submitted to an RC filter to shorten the pulse and improve the signal-to-noise ratio. However, this filter when supplied with an exponentially decaying signal produces a filtered signal with an undesirable undershoot, i.e., an excursion below baseline voltage. This is a serious problem since the radiation pulses arrive randomly in time and succeeding pulses can occur during the undershoot of a previous pulse in that case, the measurement of the amplitude of the succeeding pulse would be distorted. To compensate for this a pole-zero cancellation circuit has been used to eliminate the undershoot. In this scheme a portion of the voltage pulse input to the RC filter is diverted around the filter and combined with the filter output to cancel the undershoot. This was originally done manually. (See Nowlin et al., "Elimination of Undesirable Undershoot in the Operation and Testing of Nuclear Pulse Amplifiers", Rev. Sci. Instr., Instr., vol. 36, No. 2, December 1965, pp 830–839.) However, here was much difficulty encountered in having untrained non-technical personnel such as at medical clinics compelled to adjust the shunting resistance or other component to null the undershoot and avoid overshoot. To meet this problem a more automatic approach was proposed as in U.S. Pat. No. 4,866,400, fully incorporated herein by reference. However, even with this improved approach, more accuracy is desirable. For example, elimination of errors (glitches, pedestals, offsets and temperature drift) in the analog automatic auto-PZ sampling circuit.

SUMMARY OF INVENTION

It is therefore an object of this invention to provide an improved automatic pole-zero adjustment circuit.

It is a further object of this invention to provide such an improved automatic pole-zero adjustment circuit which is more accurate.

It is a further object of this invention to provide an improved automatic pole-zero adjustment circuit more quickly converges on the undershoot correction.

It is a further object of this invention to provide an improved automatic pole-zero adjustment circuit which is more flexible in the selection of sampling and correction circuits.

This invention results from the realization that a truly improved automatic pole-zero adjustment circuit for a ionizing radiation spectroscopy system, which is more accurate, converges more rapidly on undershoot/overshoot correction and is more flexible in the selection of sampling and correction criteria can be achieved using a digitally programmable pole-zero sampling means which can define the time and duration of a sampling window and validate or reject pulses to sampled and a digitally programmable control circuit which can choose one or more samples to determine the existence and extent of overshoot/undershoot and the conditions of satisfying or cancelling that undershoot/overshoot.

This invention features an automatic pole zero adjustment circuit for an ionizing radiation spectroscopy system. There is a high pass filter responsive to random analog pulses passing through the system and a digital conversion circuit responsive to the high pass filter for converting the random analog pulses to digital pulses. A pole-zero adjustment network coupled with the high pass filter algebraically adds a correction current to the output of the high pass filter to compensate for under/overshoot of the analog pulses. Digitally programmable pole-zero sampling means include means for defining a window for sampling a trailing edge of the digital pulses and means for sampling the digital pulses during that window to determine the presence of undershoot or overshoot. A digitally programmable control circuit responsive to the pole-zero sampling means drives the pole-zero adjustment network to introduce an under/overshoot correction current to the output of the high pass filter.

In a preferred embodiment the digital conversion circuit may include an amplifier circuit, a sampling analog to digital converter, and a digital shaping filter. The digital programmable pole-zero sampling means may include means for summing the window at a point spaced from the pulse peak by a multiple of the pulse rise time. The digitally programmable pole-zero sampling means may also include means for summing a number of samples of the digital pulses and means for validating those pulses. The means for validating the pulses may include means for determining whether the pulses are distorted by other pulses or overload, or whether the pulses are less than a predetermined level or more than the peak sampling level. The digitally programmable control circuit may include means for increasing the correction current magnitude with each required adjustment and having the correction current magnitude upon a reversal of correction direction. The control circuit may also include means for terminating the pole-zero adjustment after a predetermined number of direction reversals and/or after a preselected number of samples have been summed.

The invention also features an automatic pole-zero adjustment circuit for an ionizing radation spectroscopy system including a digital conversion circuit responsive to random analog pulses passing through the system for converting the random analog pulses to digital pulses and a programmable digital shaping filter including means for applying a pole-zero cancellation adjustment to compensate for under/overshoot at the output of the programmable digital filter. There is digitally programmable pole-zero sampling means including means for defining a window for sampling the trailing edge of the digital pulses and means for sampling the digital pulses during that window to determine the presence of undershoot or overshoot. A digitally programmable control circuit is responsive to the pole-zero sampling means for driving the programmable digital shaping filter to introduce an under/overshoot correction signal to the digital programmable shaping filter.

In a preferred embodiment the digital conversion circuit may include a sampling analog to digital converter. The digitally programmable pole-zero sampling means may include means for setting a window at a point spaced from the pulse peak by a multiple of the pulse rise time. The digitally programmable pole-zero sampling means way include means for summing a number of samples of the digital pulses. The digitally programmable pole-zero sampling means may include means for validating pulses. The means for validating pulses may include means for determining whether the pulses are less than a predetermined level or more than the peak sampling level. The means for validating the pulses may include means for determining whether the pulses have been distorted by other pulses or an overload. The digitally programmable control circuit may include means for increasing the correction magnitude with each required adjustment and having the correction magnitude upon reversal of correction detection. The digitally programmable control circuit may include means for terminating the pole-zero adjustment after a predetermined number of direction reversals. The digitally programmable control circuit may include means for terminating the pole-zero adjustment after a preselected number of samples have been summed.

DISCLOSURE OF PREFERRED EMBODIMENT

Other objects, features and advantages will occur to those skilled in the art from the following description of a preferred embodiment and the accompanying drawings, in which.

Figures 1, 3:
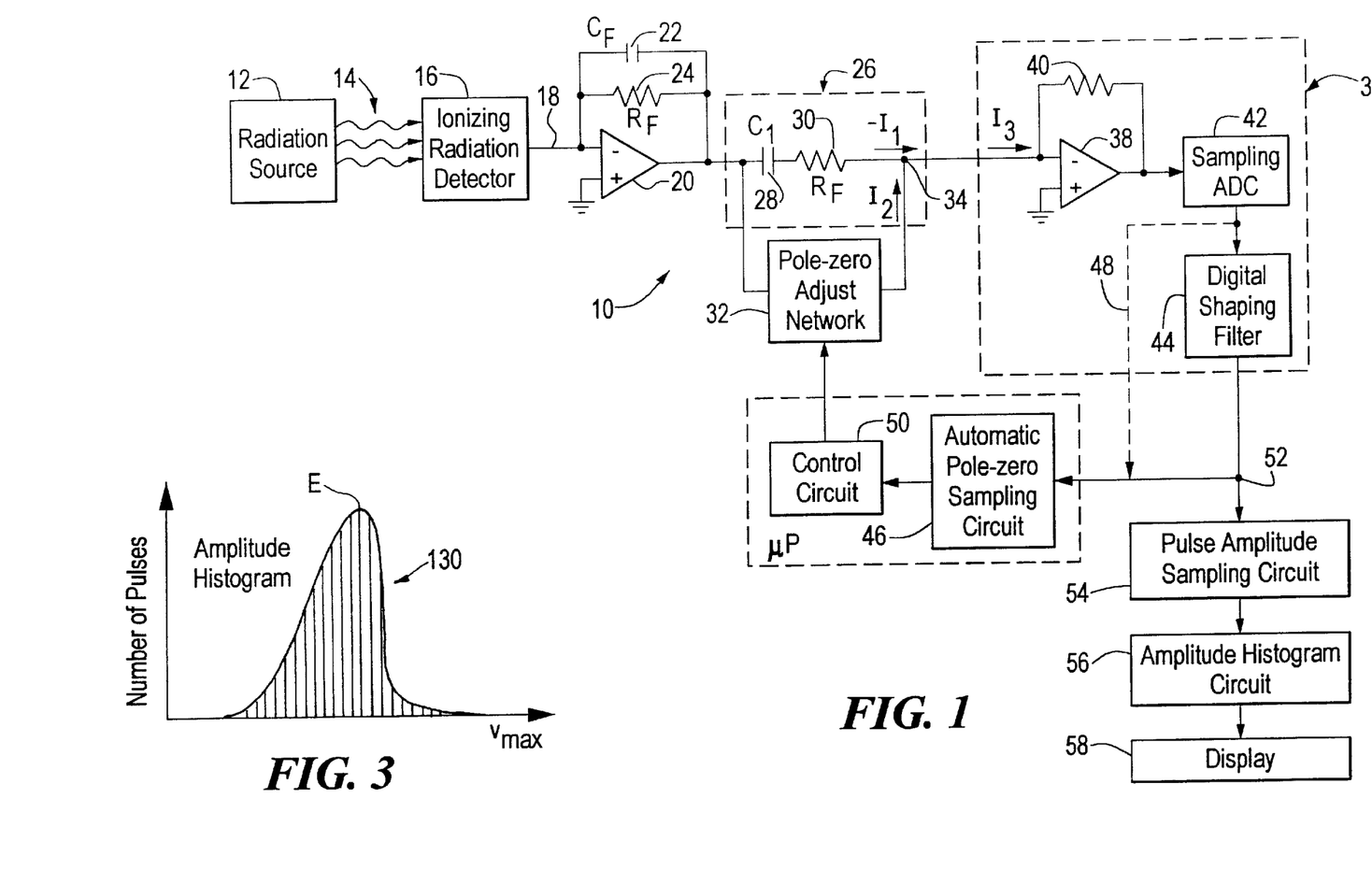
FIG. 1 is a schematic block diagram of an automatic pole-zero adjustment circuit according to this invention for an ionizing radiation spectroscopy system.
FIG. 3 illustrates a histogram obtainable with the circuit of FIG. 1.

There is shown in FIG. 1 an automatic pole-zero adjustment circuit 10 according to this invention including a source 2 of radiation such as alpha or gamma rays or light radiation. Each quantum of radiation 4 is sensed by ionizing radiation detector 16 and converted to charge, producing a current on line 8 that is submitted to preamplifier 20. Preamplifier 20 has a feedback network including capacitor $C_F$ 22 and resistor $R_F$ 24 connected in parallel. The output from preamplifier 20 is delivered to high pass filter 26 which includes a series connected capacitor $C_I$ and resistor $R_I$ 30. High pass filter 26 provides an exponential decay for a step pulse, but since the voltage supplied to the input of high pass filter 26 is actually itself a decaying voltage, the exponential decaying output of high pass filter 26 would tend to be a decaying waveform with undershoot.

Undershoot has long been a problem but it is suffered because the high pass filter is necessary to improve the signal-to-noise ratio by eliminating low frequencies and for making room for analyzing succeeding pulses by bringing each pulse to baseline as quickly as possible so that it won't interfere with the next pulse and for serving to minimize the DC offset from pulse pile-up at high repetition rates while allowing greater amplification of the signal. In order to overcome that undershoot problem pole-zero adjust network 32 is provided to introduce a correction current at node 34 which algebraically sums the current to cancel the in undershoot as will be explained infra. A pole-zero adjustment network can be a simple adjustable resistor such as a potentiometer driven by a stepping motor or can be a more sophisticated system such as shown in U.S. Pat. No. 4,866,400, which is incorporated herein by reference in its entirety. See particularly FIG. 7 of that patent. That implementation of a pole-zero adjustment network actually includes a number of amplifiers and a multiplying digital-to-analog converter MDAC or simply DAC.

The output of filter 26 is delivered to digital conversion circuit 36 where it is amplified in amplifier 38 which includes feedback resistor 40. The signal is then submitted to sampling ADC 42 which samples, (typically in this embodiment approximately every 50 nanoseconds) and converts the analog signal to a digital signal and then submits it to the digital shaping filter 44 which is a low pass filter that improves the signal-to-noise ratio by eliminating higher frequencies and results in a pulse which has a longer rise time but still represents the energy of the detected emission. The digital pulse output from digital shaping filter 44 is delivered to automatic pole-zero sampling circuit 46. Alternatively, digital shaping filter 44 may be bypassed or eliminated and the input to automatic pole-zero sampling circuit 46 can be derived directly from the output of sampling ADC 42 as indicated by dashed line 48. Automatic pole zero sampling circuit 46 defines a window for sampling and samples the digital pulse during that window to determine the existence and extent of undershoot or overshoot.

The signal representing the undershoot or overshoots delivered to control circuit 50 which provides a drive signal to pole-zero adjust network 32 to provide the necessary amount of current to be algebraically summed at node 34 of high pass filter 26 to just cancel the undershoot. The output at terminal 52 from digital shaping filter 44 is also delivered to pulse amplitude sampling circuit 54 which samples the peak amplitude of each pulse and submits it to an amplitude histogram circuit 56 which creates a histogram of the number of pulses at the different voltage levels thereby displaying one or more peaks which identify the nature of the radiant emission detected. The histogram may be viewed in display 58. Automatic pole-zero sampling circuit 46 and control circuit 50 can be implemented with a microprocessor such as an Intel 1386 in combination with a Digital Signal Processor such as a Motorola D56002.

Figure 2:
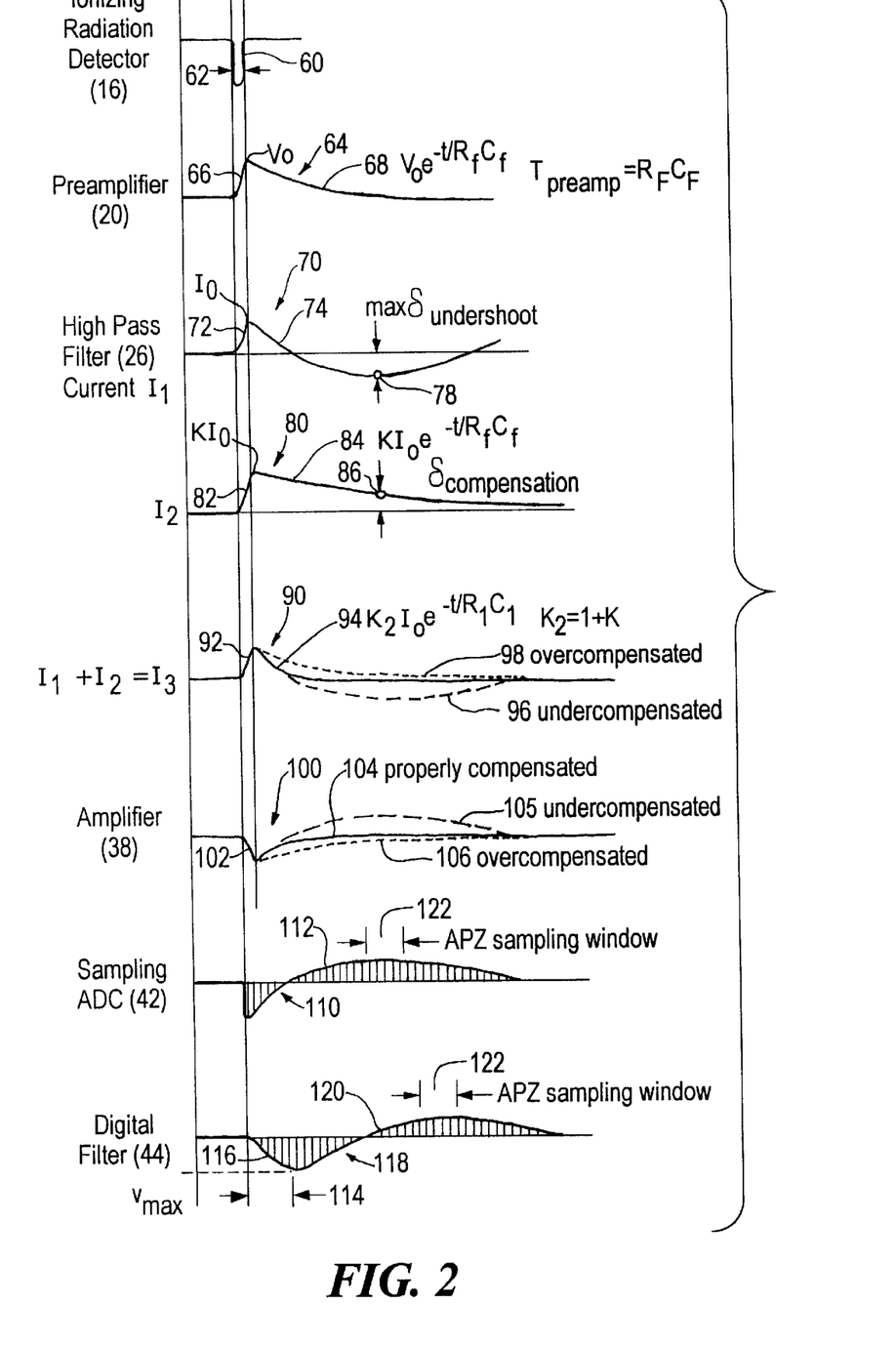
FIG. 2 depicts a series of waveforms which occur in the circuit of FIG. 1.

A fuller understanding of the operation of circuit 10, FIG. 1, can be better understood with reference to the waveforms shown in FIG. 2 that occur at various points in that circuit. At the output of ionizing radiation detector 6 the negative-going current pulse 60 represents the charge generated by the incident radiation. The duration indicated at 62 of this pulse is extremely short, typically 0.1 μs–0.6 μs, but exaggerated here for clarity. Upon passing through preamplifier 20, pulse 60 is converted to pulse 64 which has the same duration on its leading edge 66 from onset to its peak voltage $V_D$ and then has a voltage decay along its trailing edge 68 which has an exponential decay defined by the time constant of the preamplifier $\tau_{preamp} = R_F C_F$. After pulse 64 passes through filter 26 there is provided at the output of high pass filter 26 a current pulse 70 whose leading edge 72 also has a fast rise time to reach peak current $I_0$. Its decay is expressed as $$I_0 \left[ \frac{\tau_{preamp}e^{-t/R_1C_1} - R_1C_1e^{-t/\tau_{preamp}}}{\tau_{preamp} - R_1C_1} \right] \quad (1)$$

The desired time constant is $\tau_{desired}=R_1C_1$. The trailing edge 74 shows the undershoot 76 having a maximum $\delta_{undershoot}$ at point 78. The correction current $I_2$ flowing from pole-zero adjust network to node 34 is in the form of pulse 80 whose leading edge also has a fast rise time 82 in reaching peak current $KI_0$ where $$K = \frac{\tau_{desired}}{\tau_{preamp} - \tau_{desired}}.$$

The trailing edge 84 is chosen so that at the point 86 coinciding with the maximum undershoot 78 of pulse 70 the positive $\delta_{compensation}$ current is just equal to the $\delta_{undershoot}$ at 78. The trailing edge is defined as $$KI_0 e^{-t/R_f C_f} \quad (2)$$

Thus when currents $I_2$ and $I_1$ are combined (pulses 80 and 70) the resulting current, $I_3$ is the completely compensated output pulse 90 which has the undershoot exactly canceled. On pulse 90, the trailing edge, declines as quickly as possible to zero without going below, that is undershooting, the zero base line: $\delta_{compensation}$ is exactly equal to $\delta_{undershoot}$. Leading edge 92 has the same short duration as previously noted and trailing edge 94 is defined by the expression $$K_2 I_0 e^{-t/R_1 C_1} \quad (3)$$

where $K_2=1+K$. Exact compensation is critical, because undercompensaton would result in a portion of the undershoot still being present as indicated at 96, while overcompensation would result in an undesirably long return to baseline (overshoot) indicated by the dotted path 98. Pulse 90 is inverted at the output as shown by pulse 100 at the output of amplifier 38. The fast rise time leading edge 102 and the trailing edge 104 are the same as for pulse 90. The results of possible undercompensaton 105 and overcompensation 106 are illustrated as well. Sampling ADC 42 acts on pulse 100 to create a digitized pulse 110. Assuming now that there has been no compensation an undershoot 112 does appear. When pulse 110 is submitted to digital filter 44 the enhancement of the signal-to-noise ratio by the removal of the higher frequencies results in a slower rise time 114 for the leading edge 116 and the entire pulse 118 becomes less sharp and more rounded Both pulses 110 and 118 are shown as having yet uncorrected undershoot 112 and 120, respectively, in order to illustrate the position and size of window 122 which is defined by the automatic pole-zero sampling circuit 46. Pulse amplitude sampling circuit 54 samples the peak amplitude of each pulse appearing at terminal 52 and submits those pulses to amplitude histogram circuit 56 which sorts or bins them and creates a pulse amplitude histogram 130, FIG. 3, in which the number of pulses is charted against the voltage of the pulses. The peak pulse voltage E then identifies the particular radiant emission that is the source of the energy. Although histogram 130 is shown as having a single peak, more normally there would be a number of such peaks identifying the detected radiation.

Figure 4:
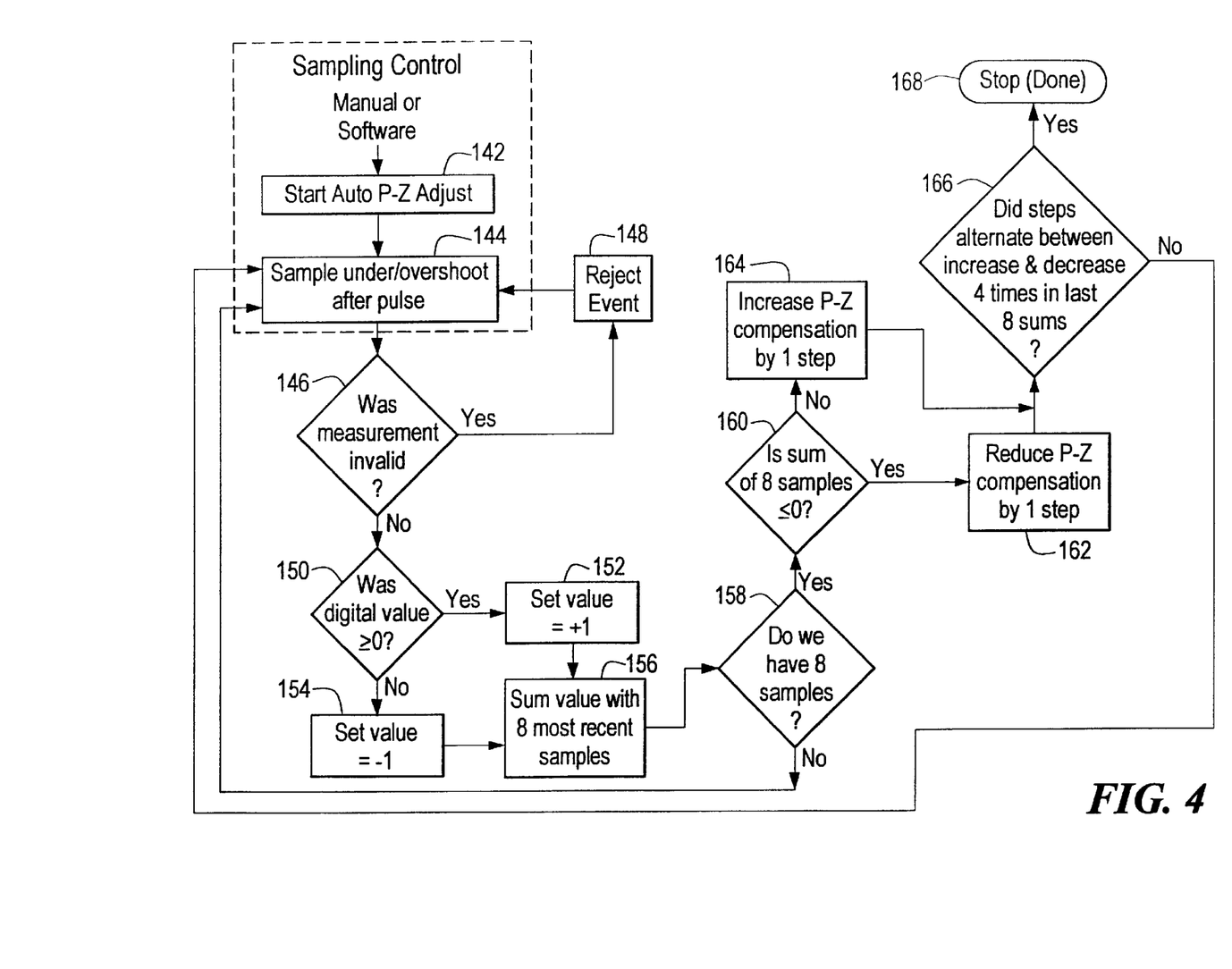
FIG. 4 is a flow chart of the software which can be used to operate the automatic pole-zero sampling circuit and control circuit of FIG. 1 implemented in a microprocessor.

The increased accuracy, speed of convergence and flexibility of the system can be seen more clearly with respect to the operation of automatic pole-zero sampling circuit 46 and control circuit 50 which may be implemented in a single microprocessor and programmed in accordance with the flow chart of FIG. 4. Operation is begun by either manual or software-actuated initiation of the Start Automatic Pole-Zero Adjust sequence in step 142. A start command is desirable since this automatic pole-zero adjustment may be necessary only at infrequent intervals. Once the sequence has begun a sample is taken to determine under- or overshoot a predetermined time after the pulse peak as indicated in step 144. Typically, but not necessarily, the sampling point may be a distance of six times the pulse 118 rise time from the peak of the pulse to the window. Next, in step 146 a determination is made as to whether the measurement was invalid and should be rejected. The measurement is invalid if it was distorted by other pulses or by an overload. Overload occurs when the code from the A/D converter exceeds a maximum allowed value. Pulse pile up is determined by a pile up rejector such as shown in U.S. Pat.No. 4,866,400 and described in *Quantitative X-ray Spectroscopy*, by Ron Jenkins, R. W. Gould and Dale Gedcke, Marcel Delsker, Inc., New York, N.Y. 1981,p. 183 both of which are incorporated herein by reference. It is also determined to be invalid if its peak height is less than a predetermined level, for example, 0.6% of the full scale range or it the samples greater than the peak height. If it is subject to such defects then the system rejects the event in step 148 and return to the sampling step in 144. A number of samples of the digital filter output are taken for each adjustment. The number may be 1, 2, 8 or hundreds depending upon the averaging desired to increase accuracy. In this embodiment eight samples are used.

Each sample is determined to be high, that is, 0 or greater, or low, less than zero. Valid high samples are assigned a value of +1 and valid low sample are assigned a value of −1. Thus, in step 150 inquiry is made as to whether the digital value was equal to or greater than zero. If it is, the value is set to 1 in step 152. If it is not, then the value is set to −1 in step 154. In either case the value of the eight most recent samples is summed in step 156. Inquiry is then made in step 158 as to whether the predetermined number of samples, in this case eight, have been processed. If not, the system returns to the sample step 144. If the predetermined number of samples has been taken then inquiry is made as to whether the sum of the eight samples is equal to or less than zero beginning in step 160. If the sum is zero or less the pole-zero compensation is reduced by one unit in step 162. If the sum is greater than zero the pole-zero compensation is increased by one unit in step 164. Faster convergence can be achieved by changing the step size at 162 and 164 in accordance with recent history. For example, the size of the adjustment can be determined by the number of consecutive adjustments previously taken in the same direction, either up or down: that is, to compensate for either overshoot or undershoot. The first adjustment is typically always one digital to analog converter (DAC) unit. If two adjustments are taken in the same direction then the adjustment size is doubled. This can occur again and again up to the maximum of 256 DAC units in this embodiment. If an adjustment is taken in the reverse direction the adjustment size is halved and the adjustment size increases are disabled for four adjustments in the same direction. If any adjustment would go past the limits of the pole-zero DAC, typically zero to 4095, then the adjustment is altered to go to the limit. If the limit is exceeded for three consecutive adjustments the automatic pole-zero adjustment process is terminated. The automatic pole-zero adjustment process also terminates when four adjustment reversals occur in the most recent eight adjustments while the adjustment size is one. The reversal count counter resets to zero if the adjustment size is greater than one.

Thus in step 160 the inquiry is made as to whether the sum of eight samples is equal to or less than zero. If it is, then the pole-zero compensation is reduced by one DAC step, that DAC being the MDAC, for example, in the pole-zero adjustment network with respect to FIG. 7 of U.S. Pat. No. 4,866,400. If the sum of eight samples is greater than zero then the pole-zero compensation is reduced by one step, step 162. If it is not equal to or less than zero then the pole-zero compensation is increased by one step as indicated in step 164. In either case, inquiry is then made in step 166 as to whether the steps alternate between increasing and decreasing four times in the last eight sums. If it has, then the system is told to stop in step 168. If it has not, then the system again makes further inquiry as to whether more than 200 sums have been gathered. If it has not, the system returns to sampling step 144.

Figure 5:
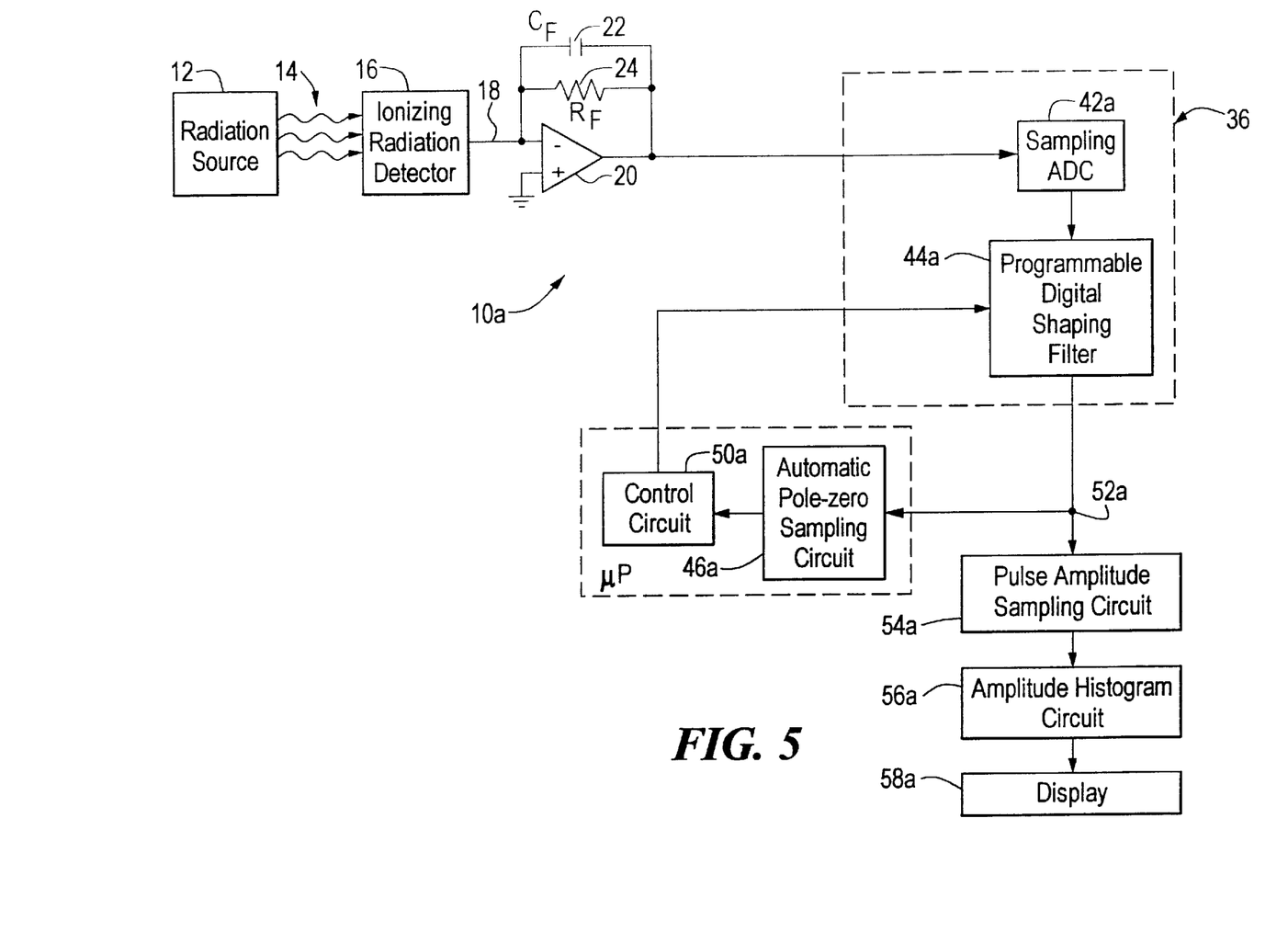
FIG. 5 is a view similar to FIG. 1 of another embodiment of the automatic pole-zero adjustment circuit according to this invention.

In another construction the high pass filter 26, pole-zero adjustment network 32 and amplifier 38 with feedback resistance 40 may be eliminated, system 10a, FIG. 5, and the compensation accomplished directly in a programmable digital shaping filter 44a which transforms the exponential pulse shape into the desired pulse shape thus eliminating the undershoot/overshoot.

The pulse at the output of ADC 42a has an exponential decay whose Z transform is described by $$\frac{1}{1 - e^{-t_a/\tau_{preamplifier}} Z^{-1}} \quad (4)$$

where $t_4$ is the sampling period of the ADC 42a.

Programmable digital shaping filter 44a transforms the pulse from ADC 42 into the desired output pulse shape by applying a digital filter of the form $$H(Z)(1 - e^{tH/\tau_{adj}} Z^{-1}) \quad (5)$$

where H(z) is the Z transform of the desired output pulse shape. The undershoot/overshoot compensation is accomplished by adjusting $\tau_{adj}$ to match $\tau_{preamplifier}$.

It will be obvious to those skilled in the art that a variety of specific criteria for detecting convergence and stopping the adjustment can be selected according to this invention.

Although specific features of the invention are shown in some drawings and not others, this is for convenience only as each feature may be combined with any or all of the other features in accordance with the invention.

Other embodiments will occur to those skilled in the art and are within following claims:

What is claimed is:

1. An automatic pole-zero adjustment circuit for an ionizing radiation spectroscopy system comprising:
   a high pass filter responsive to random analog pulses passing through the system;
   a digital conversion circuit, responsive to said high pass filter, for converting said random analog pulses to digital pulses;
   a pole-zero adjustment network coupled to said high pass filter for algebraically adding a correction current to the output of said high pass filter to compensate for under/overshoot of said digital pulses;
   digitally programmable pole-zero sampling means including means for defining a window for sampling the trailing edge of said digital pulses and means for sampling each of said digital pulses during that window to determine the presence of undershoot or overshoot; and
   a digitally programmable control circuit, responsive to said pole-zero sampling means, for driving said pole-zero adjustment network to introduce an under/overshoot correction to the output of said high pass filter.

2. The automatic pole-zero adjustment circuit for an ionizing radiation spectroscopy system of claim 1 in which said digital conversion circuit includes an amplifier circuit.

3. The automatic pole-zero adjustment circuit for an ionizing radiation spectroscopy system of claim 1 in which said digital conversion circuit includes a sampling analog to digital converter.

4. The automatic pole-zero adjustment circuit for an ionizing radiation spectroscopy system of claim 1 in which said digital conversion circuit includes a digital shaping filter.

5. The automatic pole-zero adjustment circuit for an ionizing radiation spectroscopy system of claim 1 in which said digitally programmable pole-zero sampling means includes means for summing said window at a point spaced from the pulse peak by a multiple of the pulse rise time.

6. The automatic pole-zero adjustment circuit for an ionizing radiation spectroscopy system of claim 1 in which said digitally programmable pole-zero sampling means includes means for summing a number of samples of said digital pulses.

7. The automatic pole-zero adjustment circuit for an ionizing radiation spectroscopy system of claim 1 in which said digitally programmable pole-zero sampling means includes means for validating pulses.

8. The automatic pole-zero adjustment circuit for an ionizing radiation spectroscopy system of claim 1 in which said means for validating pulses includes means for determining whether the pulses are less than a predetermined level or more than the peak sampling level.

9. The automatic pole-zero adjustment circuit for an ionizing radiation system of claim 7 in which said means for validating pulses includes means for determining whether the pulses have been distorted by other pulses or an overload.

10. The automatic pole-zero adjustment circuit for an ionizing radiation spectroscopy system of claim 1 in which said digitally programmable control circuit includes means for increasing the correction current magnitude with each required adjustment and halving the correction current magnitude upon a reversal of correction detection.

11. The automatic pole-zero adjustment circuit for an ionizing radiation spectroscopy system of claim 1 in which said digitally programmable control circuit includes means for terminating the pole-zero adjustment after a predetermined number of direction reversals.

12. The automatic pole-zero adjustment circuit for an ionizing radiation spectroscopy system of claim 6 in which said digitally programmable control circuit includes means for terminating the pole-zero adjustment after a preselected number of samples have been summed.

13. An automatic pole-zero adjustment circuit for an ionizing radiation spectroscopy system comprising:
   a digital conversion circuit responsive to random analog pulses passing through the system for converting said random analog pulses to digital pulses;
   a programmable digital shaping filter including means for applying a pole zero cancellation adjustment to compensate for under/overshoot at the output of said programmable digital shaping filter;
   digitally programmable pole-zero sampling means including means for defining a window for sampling the trailing edge of said digital pulse and means for sampling said digital pulses during that window to determine the presence of undershoot or overshoot; and
   a digitally programmable control circuit, responsive to said pole-zero sampling means, for driving said programmable digital shaping filter to introduce an under/overshoot correction signal to said digital programmable shaping filter.

14. The automatic pole-zero adjustment circuit for all ionizing radiation spectroscopy system of claim 13 in which said digital conversion circuit includes a sampling analog to digital converter.

15. The automatic pole-zero adjustment circuit for an ionizing radiation spectroscopy system of claim 13 in which said digitally programmable pole-zero sampling means includes for setting said window at a point spaced from the pulse peak by a multiple of the pulse rise time.

16. The automatic pole-zero adjustment circuit for an ionizing radiation spectroscopy system of claim 13 in which said digitally programmable pole-zero sampling means includes means for summing a number of samples of said digital pulses.

17. The automatic pole-zero adjustment circuit for an ionizing radiation spectroscopy system of claim 13 in which said digitally programmable pole-zero sampling means includes means for validating pulses.

18. The automatic pole-zero adjustment circuit for an ionizing radiation spectroscopy system of claim 13 in which said means for validating pulses includes means for determining whether the pulses are less than a predetermined level or more than the peak sampling level.

19. The automatic pole-zero adjustment circuit for an ionizing radiation system of claim 17 in which said means for validating pulses includes means for determining whether the pulses have been distorted by other pulses or an overload.

20. The automatic pole-zero adjustment circuit for an ionizing radiation spectroscopy system of claim 13 in which said digitally programmable control circuit includes means for increasing the correction magnitude with each required adjustment and halving the correction magnitude upon a reversal of correction detection.

21. The automatic pole-zero adjustment circuit for an ionizing radiation spectroscopy system of claim 13 in which said digitally programmable control circuit includes means for terminating the pole-zero adjustment after a predetermined number of direction reversals.

22. The automatic pole-zero adjustment circuit for an ionizing radiation spectroscopy system of claim 16 in which said digitally programmable control circuit includes means for terminating the pole-zero adjustment after a preselected number of samples have been summed.

* * * * *

UNITED STATES PATENT AND TRADEMARK OFFICE
CERTIFICATE OF CORRECTION

PATENT NO. : 5,872,363

DATED : February 16, 1999

INVENTOR(S) : Russell David Bingham; Jesse Ursery, Jr., both of Knoxville, Tenn.

It is certified that error appears in the above-identified patent and that said Letters Patent is hereby corrected as shown below:

In Claim 5, found at Col. 8, on line 15, the word "summing" shall be removed, and the word -- setting -- shall be inserted in its place.

Signed and Sealed this

Twentieth Day of June, 2000

*Attest:*

Q. TODD DICKINSON

*Attesting Officer*      *Director of Patents and Trademarks*